(12) United States Patent
Gilbert

(10) Patent No.: US 6,822,433 B1
(45) Date of Patent: Nov. 23, 2004

(54) GAIN AND PHASE DETECTOR HAVING DUAL LOGARITHMIC AMPLIFIERS

(75) Inventor: Barrie Gilbert, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 250 days.

(21) Appl. No.: 09/675,902

(22) Filed: Sep. 28, 2000

Related U.S. Application Data

(60) Provisional application No. 60/231,505, filed on Sep. 9, 2000.

(51) Int. Cl.[7] .............................................. G01R 25/00
(52) U.S. Cl. .................................. 324/76.77; 324/158.1
(58) Field of Search .......................... 324/158.1, 76.77, 324/772, 76.12, 76.82; 327/52, 89, 90, 96

(56) References Cited

U.S. PATENT DOCUMENTS

| | | | | |
|---|---|---|---|---|
| 4,131,254 A | * | 12/1978 | Underwood | 244/3.16 |
| 4,261,056 A | * | 4/1981 | Barnett et al. | 455/273 |
| 4,538,105 A | * | 8/1985 | Ausschnitt | 324/716 |
| 4,568,978 A | * | 2/1986 | Cosh | 348/676 |
| 4,906,836 A | * | 3/1990 | Yamashita et al. | 250/226 |
| 5,019,786 A | * | 5/1991 | Fairley et al. | 324/76.77 |
| 5,508,610 A | * | 4/1996 | Feeney et al. | 324/227 |
| 5,530,349 A | * | 6/1996 | Lopez et al. | 324/254 |
| 5,534,854 A | * | 7/1996 | Bradbury et al. | 310/68 B |
| 5,731,698 A | * | 3/1998 | Fujii et al. | 324/76.12 |
| 5,767,780 A | * | 6/1998 | Smith et al. | 324/772 |
| 5,789,927 A | * | 8/1998 | Belcher | 324/622 |
| 5,805,011 A | | 9/1998 | Comino | |
| 5,865,632 A | * | 2/1999 | Iwasaki | 324/754 |
| 6,424,212 B1 | | 7/2002 | Brandt | |
| 6,486,679 B1 | * | 11/2002 | Holt | 324/610 |

FOREIGN PATENT DOCUMENTS

JP      362179635 A   *  8/1987

OTHER PUBLICATIONS

The New IEEE Standard Dictionary of Electrical and Electronics Terms, Fifth Edition, IEEE Std 100–1992, cover pages (front and back) and pp. 717 and 916, Jan. 15, 1993.
*Monolithic Logarithmic Amplifiers* article by Barrie Gilbert, Analog Devices, Inc., Aug. 1994, pp. 1–122.

* cited by examiner

*Primary Examiner*—Robert Pascal
*Assistant Examiner*—Tung X. Nguyen
(74) *Attorney, Agent, or Firm*—Marger Johnson & McCollom, PC

(57) ABSTRACT

A gain-phase detector differentially processes the outputs from two logarithmic amplifiers to provide ratiometric gain measurement, thereby eliminating intercept as a parameter. Hard-limited outputs from the dual amplifiers are multiplied in a logarithmic scalable phase detector core to provide a calibrated phase measurement output. In the preferred embodiment, two logarithmic amplifiers and other circuitry are co-integrated on a single substrate to provide a high degree of matching between the amplifiers, thereby canceling errors in the individual frequency responses of the individual amplifiers, extending the usable frequency response, and improving effective noise figure. Other numbers of logarithmic amplifiers can be used, and their various outputs can be added, subtracted, multiplied and combined in other manners to produce continuous products, continuous quotients, mixtures of products and quotients, etc., all of RF demodulated signals.

13 Claims, 4 Drawing Sheets

GAIN AND PHASE DETECTOR HAVING DUAL LOGARITHMIC AMPLIFIERS

This application claims priority from U.S. Provisional Application No. 60/231,505 titled Gain And Phase Detector Having Dual Logarithmic Amplifiers filed Sep. 9, 2000 which is incorporated by reference.

BACKGROUND OF THE INVENTION

FIG. 1 illustrates a chain of gain stages 2 for a prior art logarithmic amplifier (log amp). A series of detector cells 4 combine the outputs from the gain stages to generate a logarithmic output $V_{OUT}$. The gain stages are typically implemented as limiting amplifiers having the form A/0. That is, for small inputs, the gain stages have an incremental gain of A, but at a certain point, the output is limited, and the incremental gain becomes zero as shown in FIG. 2. The response of the system of FIG. 1 is:

$$V_{OUT} = V_y \log\left(\frac{V_{IN}}{V_x}\right) \quad \text{(Eq. 1)}$$

where $V_y$ and $V_x$ are parameters that are built into the system and define its calibration. A Referring to FIG. 3, $V_y$ scales the slope, and $V_x$ is the intercept along the horizontal axis. The intercept is usually an extrapolated parameter because in practice, it is unlikely that the output will drop below the nose floor as shown with the broken line in FIG. 3. Both $V_x$ and $V_y$ may be temperature dependent, and must therefore be temperature compensated to maintain the accuracy of the log amp. These are matters that have received close attention in prior invention.

DETAILED DESCRIPTION

The present invention utilizes two logarithmic amplifiers (log amps) coupled to circuitry that processes the outputs from the log amps in one or more ways to perform useful functions. For example, in one aspect of the present invention, taking the difference of the logarithmic outputs from the log amps eliminates the intercept $V_x$ as a parameter when measuring the ratio of two signals, which could correspond to a system gain or loss. In another aspect of the present invention, a phase detector core can be utilized to measure the relative phase of two signals that are applied to the log amps. In a preferred embodiment, the two log amps are co-integrated as a single integrated circuit to create a combined gain-phase detector that can be described as a network analyzer on a chip. The present invention, however, is not limited to any specific embodiment, and it should be apparent that, although the principles of the present invention will be described with reference to some example embodiments illustrated below, the present invention can be modified in arrangement and detail without departing from such principles.

Figure 2:
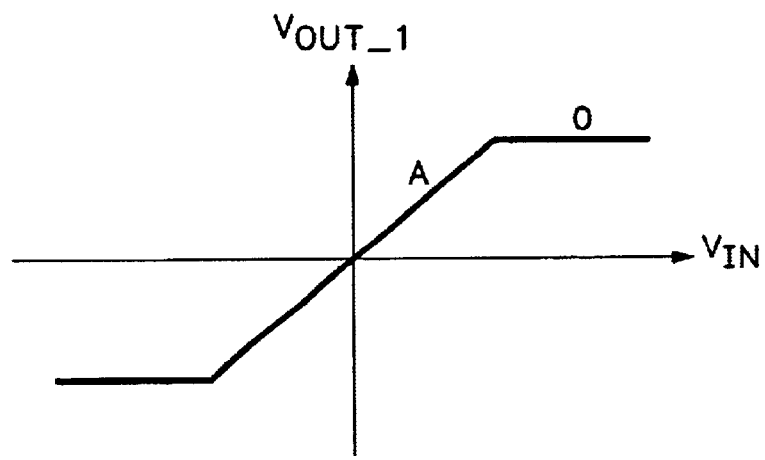
FIG. 2 illustrates the incremental gain for a limiting amplifier used as gain stage in the logarithmic amplifier of FIG. 1.
Figure 4:
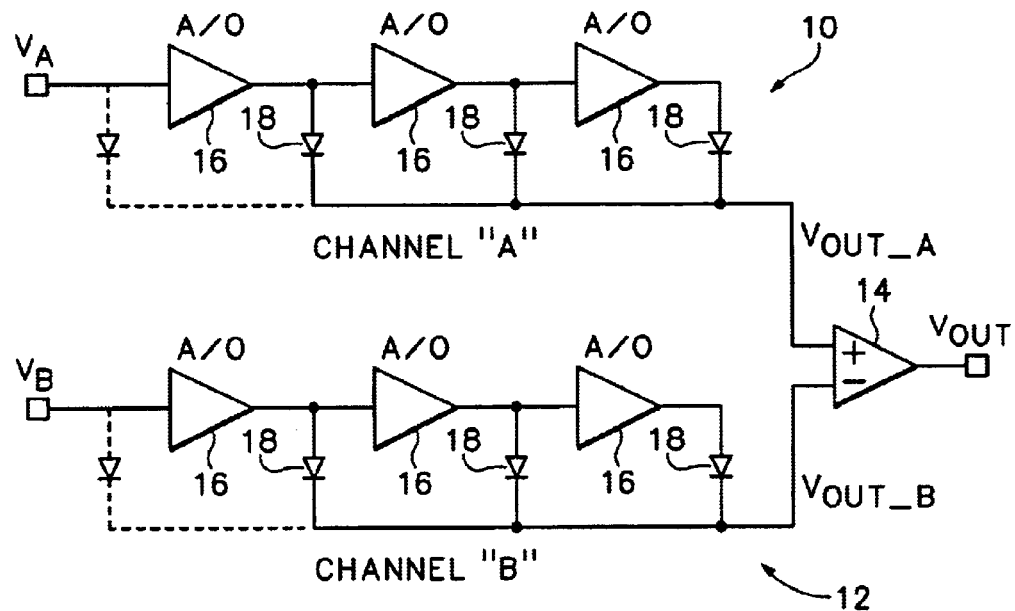
FIG. 4 illustrates an embodiment of a detector in accordance with the present invention.

As mentioned above, one aspect of the present invention involves differentially processing the logarithmic outputs from two log amps. An embodiment of a circuit that performs this function is illustrated in FIG. 4. The circuit of FIG. 4 includes a first log amp 10, a second log amp 12, and a differencing circuit 14. Each of the log amps includes a series of gain stages 16, which in this example, are limiting amplifiers having the form A/0 as shown in FIG. 2. The use of limiting amplifiers is not essential to the present invention, but they provide convenient hard-limited output signals which are especially useful for measuring phase as described below. Each log amp also includes detector cells 18 which combine the outputs from the gain stages to generate a logarithmic output.

Log amp 10 will be referred to as part of channel A, which receives the input signal $V_A$ and generates the logarithmic output signal $V_{OUT\_A}$. Likewise, log amp 12 will be referred to as part of channel B, which receives the input signal $V_B$ and generates the logarithmic output signal $V_{OUT\_B}$. For purposes of illustration, the signals utilized in FIG. 4 are shown as single-sided voltages, but the present invention can be realized with differential voltage signals, differential or single-sided current mode signals, or any convenient combination thereof. The logarithmic output signals $V_{OUT\_A}$ and $V_{OUT\_B}$ are given by the following equations:

$$V_{OUT\_A} = V_y \log\left(\frac{V_A}{V_x}\right) \quad \text{(Eq. 2)}$$

$$V_{OUT\_B} = V_y \log\left(\frac{V_B}{V_x}\right) \quad \text{(Eq. 3)}$$

The differencing circuit 14 processes the logarithmic signals differentially so that the output signal $V_{OUT}$ is given by the difference of two logarithms:

$$V_{OUT} = V_{OUT\_A} - V_{OUT\_B} = V_y \log\left(\frac{V_A}{V_B}\right) \quad \text{(Eq. 4)}$$

Figure 10:
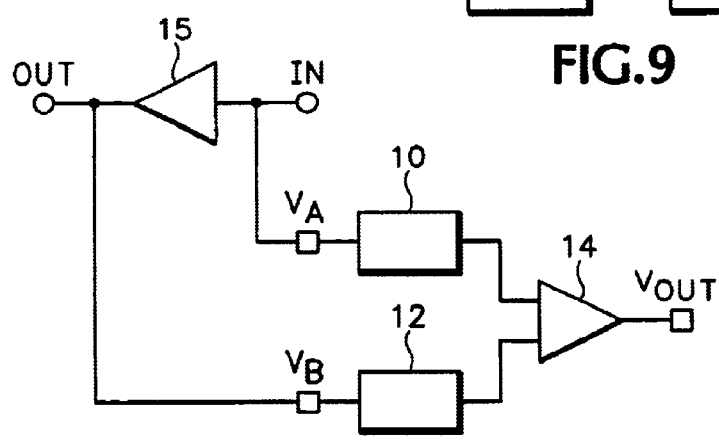
FIG. 10 illustrates an embodiment of a detector coupled to a power amnlifier in accordance with the present invention.

Thus, the intercept $V_x$, which depends on the particulars of the design of the log amps, and which is prone to error, is completely eliminated as a parameter. The output is simply proportional to the logarithm of $V_A/V_B$, with $V_y$ setting the slope. Therefore, there is no need to temperature compensate the intercept. Moreover, since the system response is ratiometric with respect to $V_A$ and $V_B$, it allows gain to be measured directly. For example, if the $V_A$ and $V_B$ inputs are connected to the input and output ports of a power amplifier 15 as shown in FIG. 10, the output $V_{OUT}$ provides a measure of the gain of the power amplifier. Normally, gain is measured by measuring the absolute power or voltage at the input port, taking another absolute measurement at the output port, and then performing a computation by hand or with a microprocessor. With the present invention, however, the absolute magnitudes do not matter since the response is entirely ratiometric. A further advantage of the system of FIG. 4 is that it tends to cancel aberrations in the frequency responses of the individual log amps, thereby extending the effective frequency response of the entire system. These and other advantages will be explained in more detail below.

The present invention also contemplates a method for utilizing two log amps as shown in FIG. 4 as an accurately calibrated log amp having an absolute intercept by indirect means. This can be achieved by applying the signal to be measured to the more accurate $V_A$ input and a reference signal to the $V_B$ input. This eliminates the need for precision internal intercept calibration and transfers it to an external source where it is easier to generate a very accurate reference signal. For example, if the reference signal is an AC excitation having the same waveform (most usually sinusoidal) as the signal to be examined, an absolute AC based intercept is achieved.

Figure 9:
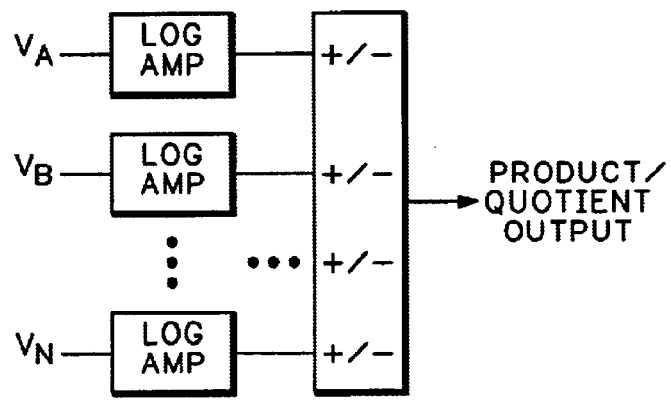
FIG. 9 illustrates another embodiment of a detector in accordance with the present invention.

The present invention also contemplates many variations to the system showing FIG. 4. For example, the differencing circuit can be modified to add or subtract the outputs from the log amps at will to produce a continuous product, a continuous quotient, a mixture of products and quotients, etc. This is especially easy if the log amps are implemented with differential current outputs which can be added or subtracted using simple wire connections as summing nodes. Moreover, although the embodiment of FIG. 4 only includes two log amps, a system in accordance with the present invention can utilize any number of log amps to provide additional functionality, such as the product of three, four, or more RF signals as shown in FIG. 9.

Even more additional techniques are contemplated by the present invention. For example, two sinusoidal signals can be applied to the $V_A$ and $V_B$ inputs to perform division from high frequency (HF) down to base band. If the amplifiers are DC coupled, then a DC signal can be applied to the $V_B$ input to set a DC intercept. Alternatively, if a DC signal is applied to the $V_A$ input, and a wide dynamic range signal is applied to the $V_B$ input, the polarity of the response is inverted, resulting in a hyperbolic response. The methods contemplated by the present invention, however, are not limited to DC or sinusoidal waveforms. For example, one particularly interesting-technique involves the use of a two log amp system according to the present invention with a base station that utilizes a code division multiple access (CDMA) transmission scheme. If a modulated CDMA signal having a complex structure is applied to the $V_A$ input, and the modulation waveform from the base band portion of the system is applied to the $V_B$ input, then the modulated signal is divided by its own modulation waveform. Thus, there is essentially an instantaneous division of a modulated RF carrier by the very modulation imposed on it. This results in an immediate analog computation of the RF power, without having to wait for the response lag of the low-pass filter conventionally required to remove fluctuations due to the modulation. Thus, a two log amp system in accordance with the present invention can be used as both an in-line processor for high volume applications such as handsets, as well as in high performance base stations as a system monitoring tool and power controller for advanced linearization techniques now in use.

Figure 5:
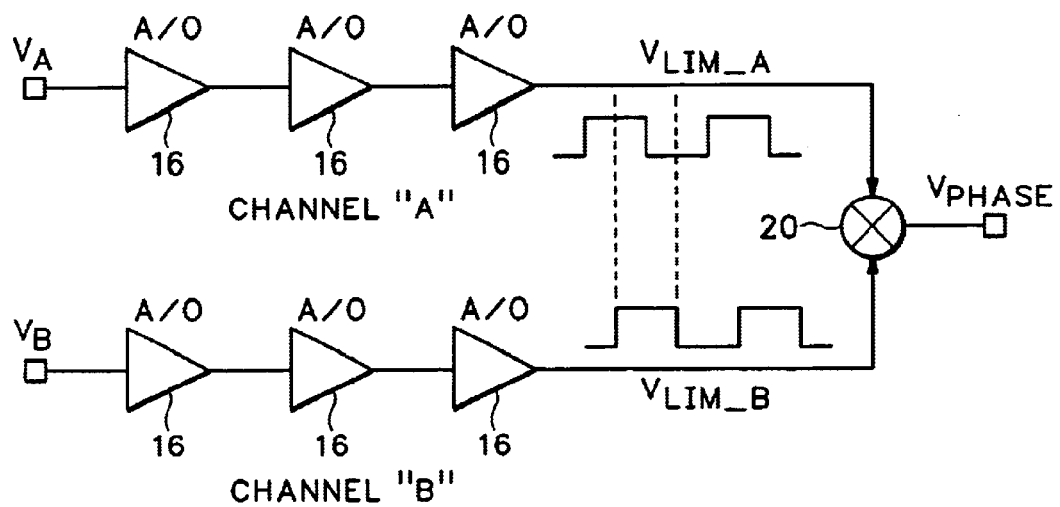
FIG. 5 illustrates another embodiment of a detector in accordance with the present invention.

Another, separable, aspect of the present invention involves the use of a phase detector core to measure the relative phase of two signals applied to the log amps as illustrated in FIG. 5. The system of FIG. 5 includes channel A and channel B log amps which are implemented with limiting amplifiers as in FIG. 4. However, rather than utilizing the logarithmic outputs $V_{OUT\_A}$ and $V_{OUT\_B}$, the system of FIG. 4 utilizes the limiting outputs $V_{LIM\_A}$ and $V_{LIM\_B}$ from the last limiting amplifier in each log amp, which are typically almost perfect, hard-limited square waves. The phase relationship between the two input signals $V_A$ and $V_B$ is embedded in the limiting outputs. A phase detector core 20, which is preferably implemented as a multiplier, processes the limiting outputs to generate a phase output $V_{PHASE}$ that provides a calibrated measure of the phase between $V_A$ and $V_B$.

The phase detector core of FIG. 5 can be added to the system of FIG. 4 to create a system that simultaneously measures both the gain and phase of the two input signals $V_A$ and $V_B$ applied to the log amps. This creates a neatly interconnected arrangement because the differencing circuit utilizes the logarithmic outputs of the log amps, while the phase detector core utilizes the limiting outputs which are generated as a byproduct in log that utilize limiting amplifiers as the gain stages. The inputs $V_A$ and $V_B$ can be coupled to two points of interest in a signal path or a system under test, and the gain and phase can be measured simultaneously. Although there are many different situations in which it is important to measure gain and phase, it is particularly useful in connection with modern power amplifiers used in base stations for wireless communications. The outputs from a gain-phase detector in accordance with the present invention can be fed back to the communication system which can then affect some signal processing to minimize distortion.

Figure 6:
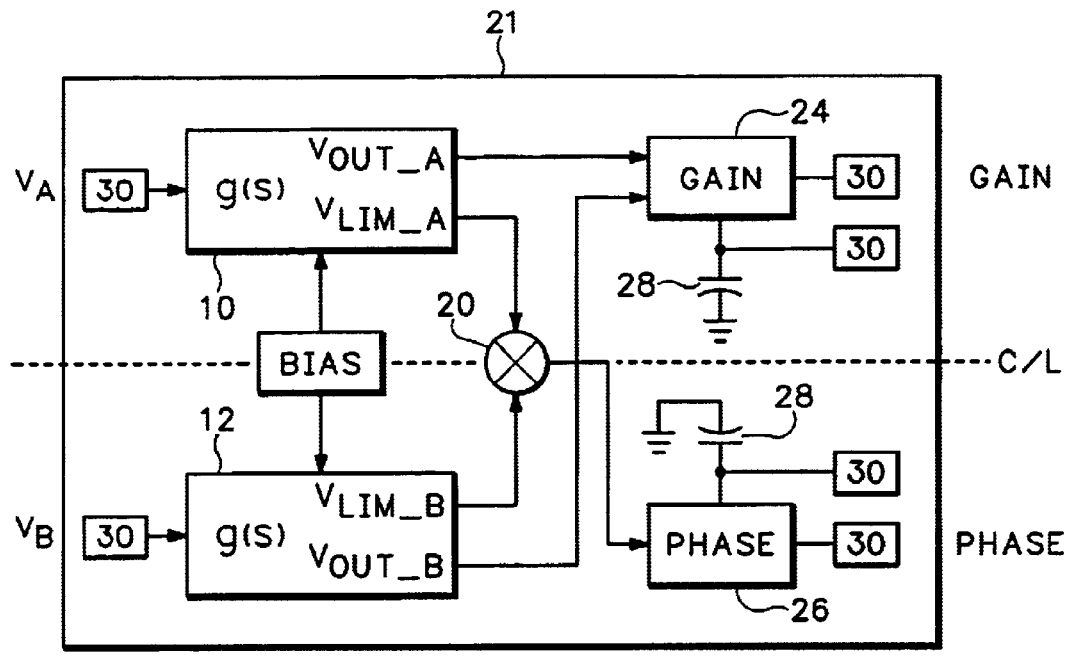
FIG. 6 illustrates the layout of an embodiment of a detector having co-integrated logarithmic amplifier in accordance with the present invention.

In a preferred embodiment, two log amps in accordance with the present invention are co-integrated into a single integrated circuit (IC) as shown in FIG. 6. The circuit of FIG. 6 is fabricated on a substrate (chip) 21 which is bisected by a center line "C/L". The channel A log amp 10 is located on the top half of the chip, while the channel B log amp 12 is formed on bottom half of the chip opposite the channel A log amp. The phase detector core 20 is located on the center line between the log amps, as is a bias-circuit 22. A gain output interface circuit 24 and a phase output interface circuit 26 are located next to the channel A and B log amps, respectively, and on opposite sides of the center line. Filter capacitors 28 are also located symmetrically on opposite sides of the center line. The components are accessed through bond pads 30 symmetrically disposed around the chip.

For ease of illustration, the components in FIG. 6 are shown utilizing single-sided signals, but in a practical embodiment, the signals would preferably be implemented as fully differential signals as is typical with integrated circuits. The gain stages in the log amps 10 and 12 are preferably implemented as limiting amplifiers such as those disclosed in U.S. patent application Ser. No. 09/241,359 titled "Logarithmic Amplifier With Self-Compensating Gain For Frequency Range Extension" filed Jan. 29, 1999 by the same inventor as the present application, and which is herein incorporated by reference.

The phase detector core 20 is preferably a four-transistor multiplier such as the one disclosed in U.S. patent application Ser. No. 09/473,309 filed Dec. 2, 1999 titled RMS-DC Converter Having Gain Stages With Variable Weighting Coefficients by the same inventor as the present application, and which is incorporated by reference. By adjusting the tail current through the multiplier, the scale factor of the phase output PHASE can be adjusted.

The gain output interface 24 includes a differencing circuit that generates the difference in the logarithmic outputs from the log amps. If the phase detector core is implemented with a circuit that generates a fully differential output signal, then the phase output interface circuit 26 should also preferably include a differencing circuit to convert the differential output from the phase detector core to a single-sided signal. Both the gain output interface 24 and the phase output interface circuit 26 preferably include rail-to-rail output buffers that provide single-sided output signals GAIN and PHASE having the widest possible voltage range for a given supply voltage.

The bias circuit 22 generates bias signals that are used for biasing the various components of the system of FIG. 6 and to set the slope of the log amps 10 and 12.

Filter capacitors 28 provide independent high frequency filtering for both the gain and phase outputs, and the capacitor connections are preferably brought outside of the chip package through bond pads so that external capacitors can be added to extend the filtering time constants for both gain and phase.

Figure 7:
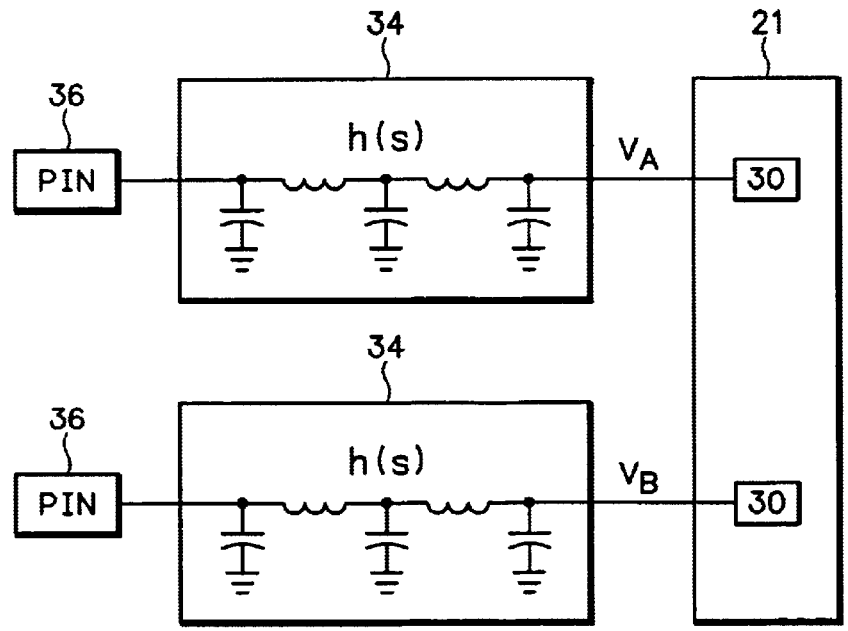
FIG. 7 illustrates generally the packaging parasitics associated with a practical embodiment of a detector in accordance with the present invention.

One advantage of co-integrating two log amps into a single integrated circuit in accordance with the present invention is that it allows for cancellation of packaging parasitics. For example, the IC chip 21 of FIG. 6 would typically be mounted in a package having terminal pins that are connected to the bond pads by bondwires. The bondwires and pins have inductances, and there are typically stray capacitances associated with the pins, bond pads and bondwires. These parasitic reactances are shown generically in FIG. 7 as networks 34 coupled between pins 36 and bond pads 30 on the chip 21. Each of the networks has a general frequency response that can be denoted by h(s), where s is the complex frequency. By observing careful symmetry in the layout of the chip (which is generally symmetric about the center line C/L in FIG. 6) and the disposition of the chip within the package, the frequency behavior of both of the networks 34 are identical, so their effects cancel in the ratio. Thus, a symmetrically designed system in accordance with the present invention also eliminates measurement uncertainties arising from packaging parasitics.

Figure 8:
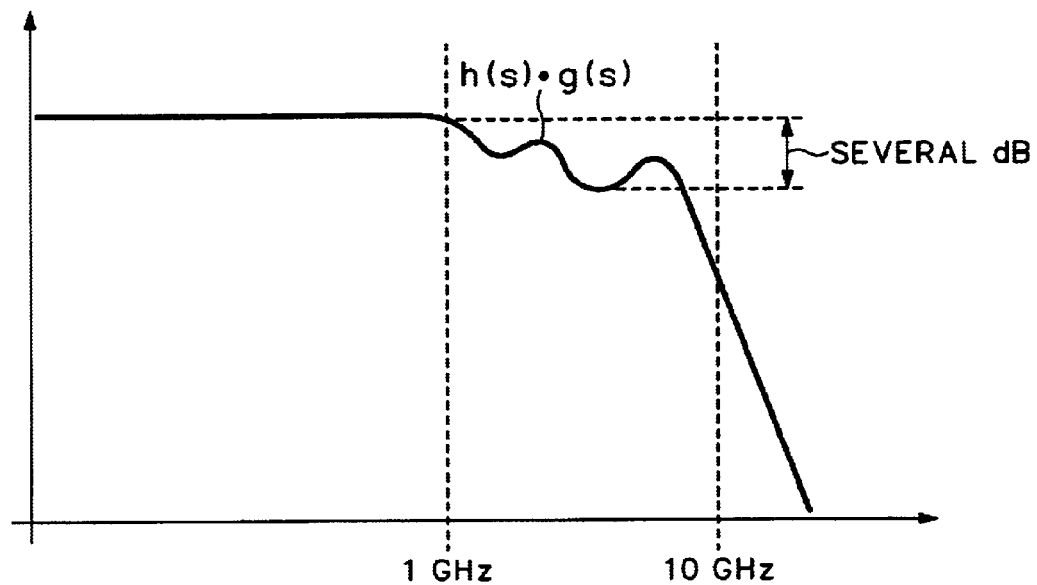
FIG. 8 illustrates the frequency response of each channel taken separately of an embodiment of a detector in accordance with the present invention.

A further advantage of the present invention can be understood by first considering the in frequency response of each log amp as a stand-alone element having a frequency response g(s). The combined of each log amp and its respective parasitic network 34 is h(s)·g(s) as shown in FIG. 8. The response is quite flat out to about 1 GHz, but may then develop variations that are shown here as generic curves between 1 GHz and 10 GHz. The amplitude of these variations can be several dB, which represents a significant measurement error because it is uncertain where such variations will occur unless they are mapped to a lookup table.

However, by using two log amps in accordance with the present invention, and by designing the channel A and channel B log amps to have the same frequency response, the numerator and denominator of the function being measured suffer from the same variations. That is, $V_A$ and $V_B$ are each multiplied by h(s)·g(s), so their effects cancel:

$$V_{OUT} = V_y \log\left(\frac{V_A}{V_B} \cdot \frac{h(s) \cdot g(s)}{h(s) \cdot g(s)}\right) \quad \text{(Eq. 6)}$$

Thus, instead of having a limited frequency range above which errors accumulate rapidly, the build-up of errors in the ratio measurement is deferred to a much higher frequency by virtue of cancellation of the independent frequency responses of the log amps, as well as the cancellation of the packaging parasitics.

Figure 1:
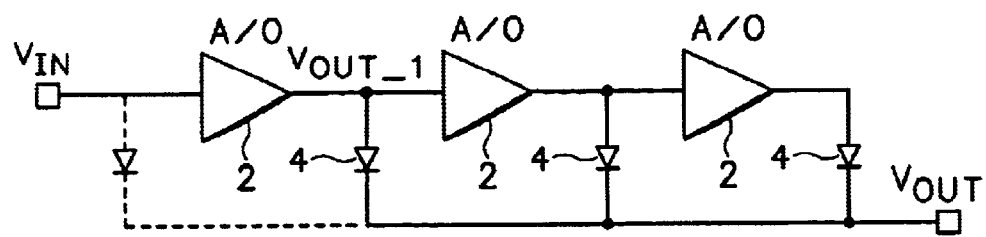
FIG. 1 is a schematic diagram of a prior art logarithmic amplifier.

Another advantage of the present invention relates to noise performance. In the case of the prior art log amp shown in FIG. 1, the noise voltage en figures into the output characteristic as follows:

$$V_{OUT} = V_y \log\left(\frac{V_{IN} + e_n}{V_x}\right) \quad \text{(Eq. 7)}$$

Figure 3:
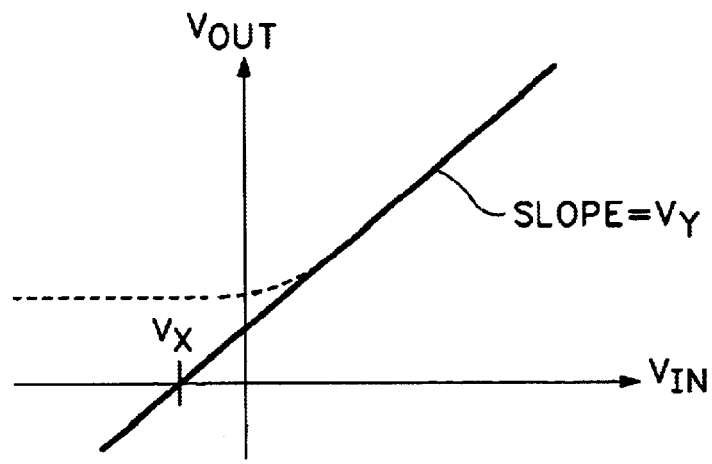
FIG. 3 illustrates the output characteristic of the logarithmic amplifier of FIG. 1.

As Vin approaches zero, there is a residual response due to noise generated in the log amps which is shown as the broken line in FIG. 3. In this region, measurement errors become large. However, with two log amps in accordance with the present invention, the noise affects the output as follows:

$$V_{OUT} = V_y \log\left(\frac{V_A + e_n}{V_B + e_n}\right) \quad \text{(Eq. 8)}$$

If the noise voltages are well-matched (which is especially easy to achieve with co-integrated log amps), then when $V_A$ and $V_B$ are equally small, $V_{OUT}$ is proportional to the log of one, which is zero, as it should be for equal signals of any amplitude, including very small signals. While not perfect, the reduction in measurement error is significant and of considerable practical value.

Having described and illustrated the principles of the invention in a preferred embodiment thereof, it should be apparent that the invention can be modified in arrangement and detail without departing from such principles. I claim all modifications and variations coming within the spirit and scope of the following claims.

What is claimed is:

1. A measurement system comprising:
   a first log amp;
   a second log amp;
   a differencing circuit coupled to the first and second log amps; and
   a phase detector core coupled to the first and second log amps.

2. A measurement system according to claim 1 wherein:
   the first log amp has a first limiting output coupled to a first input of the phase detector core; and
   the second log amp has a second limiting output coupled to a second input of the phase detector core.

3. A measurement system according to claim 2 wherein the detector core comprises a multiplier.

4. A measurement system according to claim 1 further comprising an output interface circuit coupled to the phase detector core.

5. A measurement system comprising:
   a first log amp;
   a second log amp;
   a first parasitic network coupled to the first log amp; and
   a second parasitic network coupled to the second log amp;
   wherein the first and second log amps are co-integrated on a substrate;
   wherein the substrate is mounted in a package; and
   wherein the first and second parasitic networks have similar frequency responses.

6. A measurement system comprising:
   a first log amp;
   a second log amp;
   a differencing circuit having first and second inputs coupled to the first and second log amps, respectively; and a third log amp coupled to a third input of the differencing circuit.

7. A measurement system comprising:

a first log amp;

a second log amp;

a differencing circuit having first and second inputs coupled to the first and second log amps, respectively; and one or more additional log amps coupled to one or more additional inputs of the differencing circuit.

8. A measurement system comprising:

a first log amp having a first limiting output;

a second log amp having a second limiting output; and a phase detector core coupled to the first and second log amps to receive the first and second limiting outputs.

9. A measurement system according to claim 8 wherein the phase detector core comprises a multiplier.

10. A measurement system according to claim 8 wherein the first and second log amps are co-integrated on a substrate.

11. An integrated circuit comprising:

two or more log amps a differencing circuit coupled to the two or more log amps; and a phase detector core coupled to the two or more log amps.

12. A method comprising:

logarithmically amplifying a first input signal, thereby generating a first output signal;

logarithmically amplifying a second input signal, thereby generating a second output signal; and differentially processing the first and second output signals wherein:

the first and second output signals are limiting output signals; and differentially processing the first and second output signals comprises multiplying the first and second output signals.

13. A measurement system comprising:

a first progressive compression log amp;

a second progressive compression log amp;

a differencing circuit coupled to the first and second log amps, wherein the differencing circuit is arranged to continuously process outputs from the first and second log amps; and a power amplifier having an input coupled to an input of the first log amp and an output coupled to an input of the second log amp.

* * * * *

UNITED STATES PATENT AND TRADEMARK OFFICE
CERTIFICATE OF CORRECTION

PATENT NO.    : 6,822,433 B1
DATED         : November 23, 2004
INVENTOR(S)   : Gilbert It is certified that error appears in the above-identified patent and that said Letters Patent is hereby corrected as shown below:

Column 3,
Line 24, replace "system showing FIG. 4" with -- system shown in FIG. 4 --.
Line 47, replace "interesting- technique" with -- interesting technique --.

Column 4,
Line 41, replace "bias-circuit 22" with -- bias circuit 22 --.
Line 55, replace "U.S. patent application" with -- U.S. Patent Appliction --.
Lines 61 and 62, replace "U.S. patent application" with -- U.S. Patent Application --.
Line 62, replace "filed Dec. 2, 1999" with -- filed Dec. 28, 1999 --.

Column 5,
Line 41, replace "the in frequency" with -- the frequency --.

Column 6,
Line 3, replace "voltage en figures" with -- voltage en figures --.

Signed and Sealed this

Thirty-first Day of January, 2006

JON W. DUDAS
*Director of the United States Patent and Trademark Office*